US006813743B1

(12) United States Patent
Eidson

(10) Patent No.: US 6,813,743 B1
(45) Date of Patent: Nov. 2, 2004

(54) SLIDING WINDOW TECHNIQUE FOR MAP DECODERS

(75) Inventor: Donald Brian Eidson, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 723 days.

(21) Appl. No.: 09/629,122

(22) Filed: Jul. 31, 2000

(51) Int. Cl.[7] .............................................. H03M 13/03
(52) U.S. Cl. ........................ 714/795; 375/341; 714/755; 714/786
(58) Field of Search ................................ 375/265, 341, 375/262; 714/746, 752, 786, 792, 794, 795, 775, 787, 755, 762; 341/107; 348/734

(56) References Cited

U.S. PATENT DOCUMENTS

| 4,291,406 | A | * | 9/1981 | Bahl et al. ................... 714/787 |
| 5,329,535 | A | * | 7/1994 | Coker ......................... 714/762 |
| 5,724,106 | A | * | 3/1998 | Autry et al. ................. 348/734 |
| 5,933,462 | A | * | 8/1999 | Viterbi et al. ............... 375/341 |
| 6,023,783 | A |   | 2/2000 | Divsalar et al. ............. 714/792 |
| 6,128,765 | A | * | 10/2000 | Ross et al. .................. 714/786 |
| 6,421,804 | B1 | * | 7/2002 | Lee ............................ 714/755 |
| 6,477,681 | B1 | * | 11/2002 | Taipale et al. ............... 714/795 |
| 6,580,767 | B1 | * | 6/2003 | Koehler et al. .............. 375/341 |

OTHER PUBLICATIONS

Bahl, L.R., et al., *Optimal Decoding of Linear Codes for Minimizing Symbol Error Rate*; IEEE Transactions on Information Theory; Mar. 1974; pp. 284–287.

Berrou, Claude, et al., *Near Shannon Limit Error—Correcting Coding and Decoding: Turbo–Codes (1)*, Integrated Circuits for Telecommunication Laboratory et al., 1993, IEEE, pp. 1064–1070.

Viterbi, Andrew J., *An Intuitive Justification and a Simplified Implementation of the MAP Decoder for Convolutional Codes*; IEEE Journal on Selected Areas in Communications, vol. 16, No. 2, Feb. 1998., pp. 260–264.

Benedetto, S., et al., *A Soft–Input Soft–Output Maximum A Posteriori (MAP) Module to Decode Parallel and Serial Concatenated Codes*; TDA Progress Report, 42–127, Nov. 1996, pp. 1–20.

Benedetto, S. and Montorsi, G., *Iterative decoding of serially concatenated convolutional codes*; Electronics Letters, vol. 32, No. 13, Jun. 1996, pp. 1186–1188.

Benedetto, S. and Montorsi, G., *Serial concatenation of block and convolutional codes*; Electronics Letters, vol. 32, No. 10, May 1996, pp. 887–888.

(List continued on next page.)

Primary Examiner—Albert Decady
Assistant Examiner—Dipakkumar Gandhi
(74) Attorney, Agent, or Firm—Howrey Simon Arnold & White LLP

(57) ABSTRACT

A MAP decoding system in which one or more backward engines operate to calculate backward state probabilities for sub-blocks within a sliding window stored in a memory. One or more forward engines calculate forward state probabilities for a sub-block in the same order as the encoded symbols for the sub-block are stored. Calculation of the forward state probabilities for a sub-block are deferred until the backward state probabilities for the sub-block have been calculated. Responsive to the calculation of the forward and backward state probabilities, the one or more forward engines calculate and release soft outputs for a sub-block in synchronization with the calculation of the forward state probabilities. The sliding window may be moved throughout the block, and the foregoing process repeated until soft outputs for the entire block have been released.

46 Claims, 8 Drawing Sheets

OTHER PUBLICATIONS

Divsalar, D. and Pollara, F., *Serial and Hydrid Concatenated Codes with Applications*; Jet Propulsion Laboratory, California Institute of Technology, pp. 1–8.

Divsalar, D. and Pollara, F., *Turbo Trellis Coded Modulation with Iterative Decoding for Mobile Satellite Communications*; Jet Propulsion Laboratory, California Institute of Technology, pp. 1–7.

Hoeher, Peter and Lodge, John, *"Turbo DPSK": Iterative Differential PSK Demodulation and Channel Decoding*; IEEE Transactions on Communications, vol. 47, No. 6, Jun. 1999, pp. 837–843.

Narayanan, Krishna R. and Stüber, Gordon L., *A Serial Concatenation Approach to Iterative Demodulation and Decoding*; IEE Transactions on Communications, vol. 47, No. 7, Jul. 1999, pp. 956–961.

Robertson, P., et al., *A Comparison of Optimal and Sub–Optimal MAP Decoding Algorithms Operating in the Log Domain*; IEEE, 1995, pp. 1009–1013.

Pietrobon, S., *"Efficient Implementation of Continuous MAP Decoders and a Synchonisation Technique for Turbo Decoders,"* pp. 1–4, reprinted from Proc. Int. Symp. Inform. Theory Appl., Victoria, B.C., Canada, 1996, pp. 586–589.

* cited by examiner

SLIDING WINDOW TECHNIQUE FOR MAP DECODERS

BACKGROUND OF THE INVENTION

1. Field of the Invention

This invention generally relates to maximum a posteriori (MAP) decoders, and, more specifically, to efficiently performing decoding of large blocks of coded symbols or bits with a MAP decoder.

2. Background

MAP decoders were proposed over two decades ago in "Optimal Decoding of Linear Codes for Minimizing Symbol Error Rate," L. R. Bahl et al., IEEE Transactions on Information Theory, March 1974, pp. 27–30 (hereinafter referred to as "the Bahl reference"). More recently, refinements to MAP decoders have been proposed in "Near Shannon Limit Error-Correcting Coding and Decoding: Turbo Codes," C. Berrou et al., Proc. ICC '93 Geneva, Switzerland, May 1993, pp. 1064–1070 (hereinafter referred to as "the Berrou reference"). Both the Bahl and Berrou references are hereby fully incorporated by reference herein as though set forth in full.

Because of its increased complexity in relation to Viterbi decoders, the MAP decoder has not been widely adopted. The problem is compounded when long blocks are used, stemming from the use of long interleavers during the encoding process. To simplify the decoding process, a sliding window technique has been proposed in "An Intuitive Justification and a Simplified Implementation of the MAP Decoder for Convolutional Codes," A. Viterbi, IEEE Journal On Selected Areas In Telecommunications, Vol. 16, No. 2, February 1998, pp. 260–264 (hereinafter referred to as "the Viterbi reference"), which is hereby fully incorporated by reference herein as though set forth in full. However, the sliding window technique proposed in the Viterbi reference releases soft decisions in awkward fits and starts in which soft decisions for successive sub-blocks are released in consecutive order, but the soft decisions for each subblock are released in reverse order. Because of this order of data release, the sliding window technique proposed in the Viterbi reference is not efficient in the use of memory. Another problem is that there is a variable delay between the initiation of processing and the release of soft outputs. That makes subsequent processing utilizing the soft outputs more difficult.

SUMMARY OF THE INVENTION

In accordance with one aspect of the invention, there is provided a MAP decoding system in which one or more forward engines and one or more backward engines operate in unison to calculate the soft outputs for encoded symbols within a sliding window of a larger block. The one or more backward engines calculate backward probabilities over respective sub-blocks within a sliding window. In synchronization with the one or more backward engines, the one or more forward engines recursively calculate forward probabilities over the successive sub-blocks. In synchronization with the calculation of the forward probabilities, the one or more forward engines calculate and release soft outputs for the successive sub-blocks. The sliding window is then moved forward or backward and the calculations performed on a different portion of the block. The process repeats itself until the entire block has been processed.

DETAILED DESCRIPTION OF THE PREFERRED EMBODIMENTS

A. Example Environments

Figure 1:
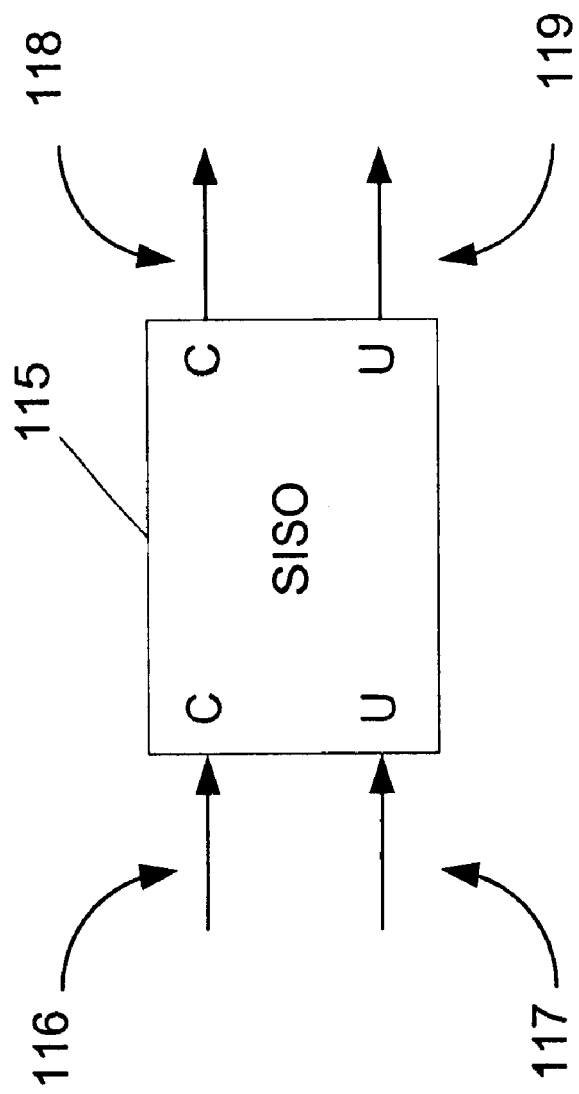
FIG. 1 is a block diagram of an implementation of a MAP decoder known as a SISO module.

A block diagram of one implementation a MAP decoder 115 is illustrated in FIG. 1. In this particular implementation, the decoder is a four port device known as a soft input soft output (SISO) module. The module has two inputs, a coded (C) symbol input, and an uncoded (U) bit input, and two outputs, a coded (C) symbol output, and an uncoded (U) bit output. The decoder 115 may be self-contained, or may be a constituent decoder of a turbo decoder such as a serial-concatenated convolutional code (SCCC) decoder, a parallel-concatenated coder decoder, a self-concatenated convolutional code decoder, a serial-concatenated trellis-coded modulation (SCTCM) decoder, or the like.

The decoder receives a priori information about one or both of encoded symbols or corresponding source bits, and outputs a posteriori information about one or both of the encoded symbols or the source bits. The a posteriori information may be used to form estimates of either the encoded symbols or the source bits, and may form a prior information which is input to another constituent decoder.

A priori information about the encoded symbols is input to the C input of SISO 115. In one implementation, this comprises encoded symbols output by a convolutional or turbo encoder and perturbed by noise through transmission over the wireless interface. A priori information about the corresponding source bits is provided to the U input of SISO 115. A posteriori information about the encoded symbols is output from the C output of SISO 115. A posteriori information about the source bits is output from the U output of SISO 115. The a posteriori information regarding the encoded symbols or source bits may be used to form estimates respectively of the encoded symbols or source bits.

Figure 2:
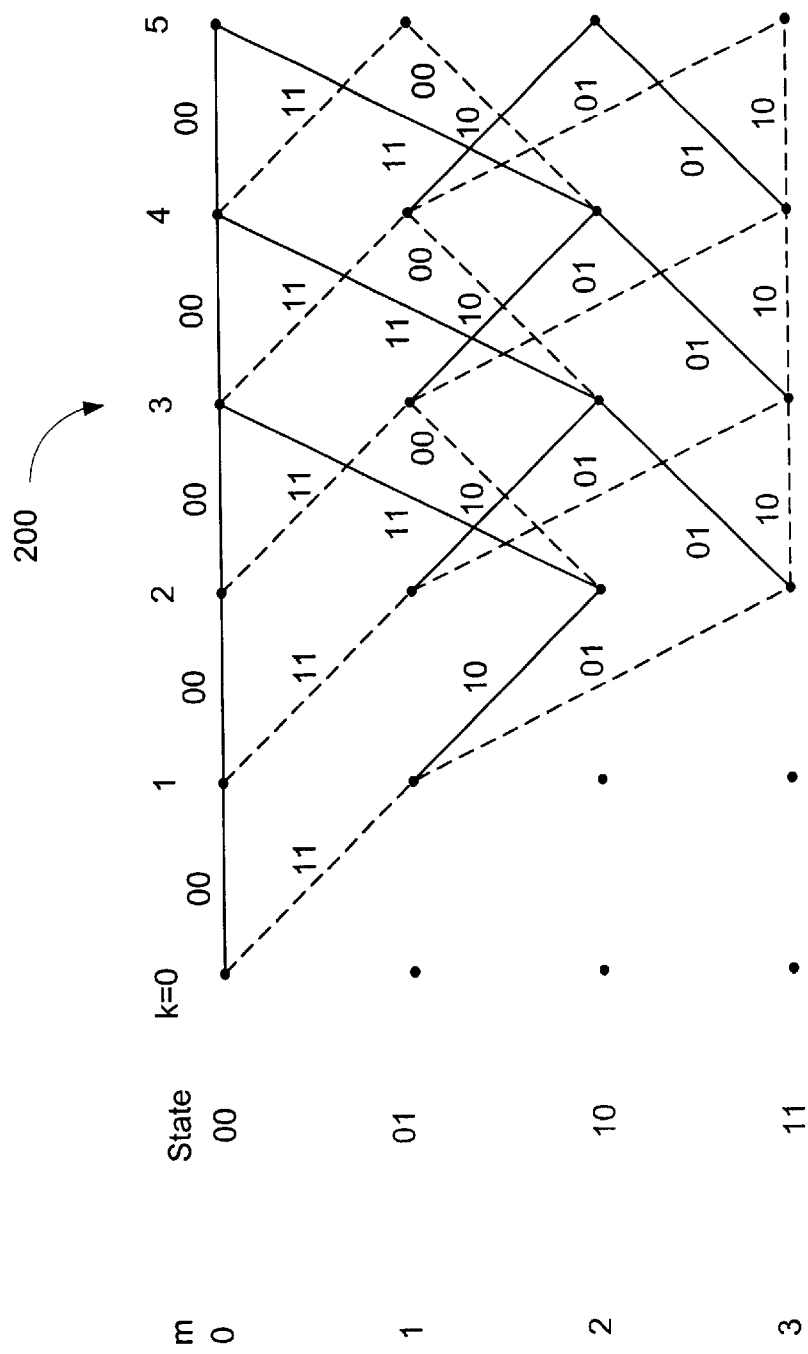
FIG. 2 is an example of a trellis diagram.

The process employed by the SISO can be further explained in relation to a trellis diagram, an example of which is illustrated in FIG. 2. The horizontal axis of the trellis represents time, while the vertical axis represents the possible states of the corresponding convolutional encoder. The index k is used to refer to time, while the index m is used to refer to the state of the corresponding convolutional encoder. The branches represent permissible state transitions. A solid branch represents a state transition that occurs upon the receipt of a source bit which is a logical zero, while a dashed branch represents a state transition that occurs upon the receipt of a source bit which is a logical one. Each branch is labeled with the corresponding encoder output.

As blocks of encoded symbols are received over the channel, the SISO recursively calculates forward state probabilities, that is, probabilities which, at time k, are computed based on the state and branch probabilities for time k−1. The forward probabilities are computed for each of the nodes m. In addition, the SISO recursively calculates reverse state probabilities, that is, probabilities which, at time k, are computed based on the branch and state probabilities for time k+1.

The calculation of the forward and reverse probabilities may occur through independent processes which at some point will meet or overlap. At the point in the trellis where these two processes meet, transition probabilities can be computed. These transition probabilities may then used to compute log-likelihood ratios (LLRs).

Eventually, LLRs or LLs may be computed for each of the times k represented by the trellis. LLRs for unencoded source bits and LLs for coded symbols may be computed. (LLs are discussed infra). The LLRs may be used to compute estimates of the source bits. The LLs may be used to compute estimates of the encoded symbols.

The process is a modified form of the algorithm described in the Bahl reference, with the specific modifications thereof being described in the Berrou reference. Both of these references were previously incorporated by reference.

Figure 5:
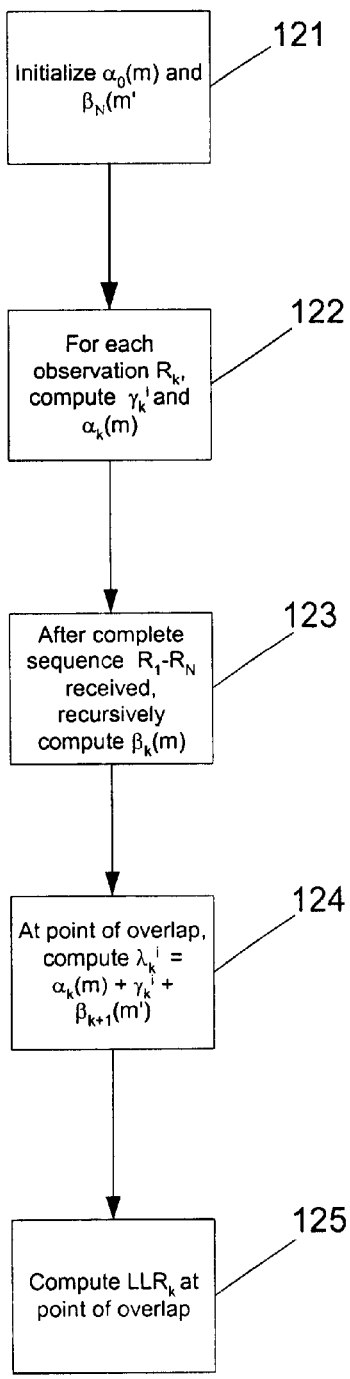
FIG. 5 is an embodiment of a decoding process employed by the SISO of FIG. 1.

A flowchart of one embodiment of the process is illustrated in FIG. 5. In this embodiment, probabilities are expressed in the log-domain to improve computational efficiency. In this flowchart, the notation $\alpha_k(m)$ refers to the natural log domain (hereinafter referred to as "log domain") forward probability of being in state m at time k; $\gamma_k^i$ refers to the log domain edge probability for edge i at time k; and $\beta_k(m)$ refers to the log domain reverse probability of being in state m at time k. Since the probabilities are expressed in the log domain, the process may be referred to as a log MAP process. It is assumed that a block of symbols has been received over a channel and needs to be decoded.

In step 121, the boundary values $\alpha_0(m)$ and $\beta_N(m)$ are initialized for all values of m.

In step 122, for each observation $R_k$, $\alpha_k(m)$ and $\gamma_k^i$ are computed for all values of m and i. Note that the "observation" $R_k$ may be a channel symbol as perturbed by noise through passage through the channel, or other a priori information regarding the channel symbols or source bits. Advantageously, the forward probabilities $\alpha_k(m)$ are computed recursively as a function of $\alpha_{k-1}(m)$. In implementation, this step is performed using equations (21) and (23) from the Berrou reference.

Figure 3:
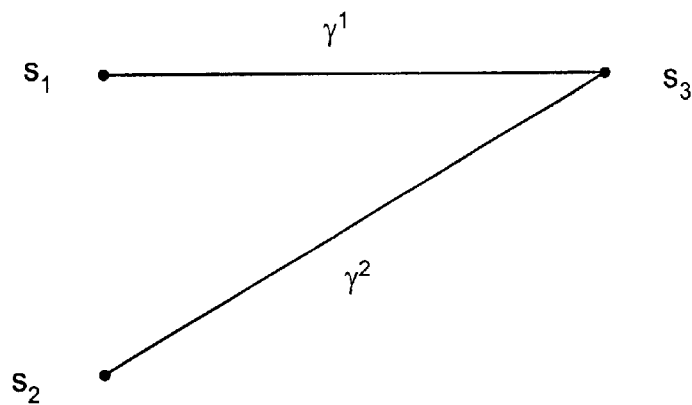
FIG. 3 is an example of the calculation of a forward state probability.

An example of a process for computing forward probabilities is illustrated in FIG. 3. In this example, there are two permissible branches into state $s_3$, one from state $s_1$ and one from state $s_2$. The log domain probability of $s_1$, $\alpha(1)$, and the log domain probability of $s_2$, $\alpha(2)$, have been previously determined. Similarly, the log domain edge probabilities $\gamma^1$ and $\gamma^2$ have been previously determined. The objective is to compute the log domain probability of the state $s_3$, $\alpha(3)$, from the foregoing parameters.

In this example, the calculation of the probability $\alpha(3)$ can be expressed using the following equation:

$$\alpha(3)=\mathrm{MAX}^*(\alpha(1)+\gamma^1,\alpha(2)+\gamma^2)$$

where the function MAX*(A,B) is defined to be:

$$\mathrm{MAX}^*(A,B)=\mathrm{MAX}(A,B)+ln(1+\exp(|A-B|))$$

In step 123, the reverse probabilities $\beta_k(m)$ are computed for all values of m. Advantageously, the probabilities $\beta_k(m)$ are computed recursively as a function of $\beta_{k+1}(m)$. In one implementation, this step is performed using equation (22) from the Berrou reference.

Figure 4A:
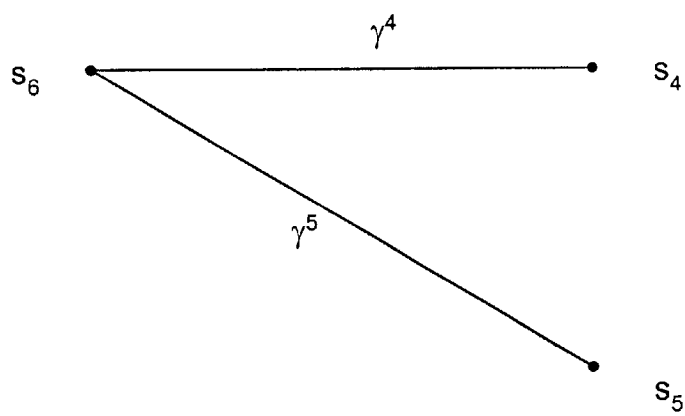
FIG. 4A is an example of the calculation of a reverse state probability.

An example of a process for computing reverse probabilities is illustrated in FIG. 4A. In this example, there are two permissible branches into state $s_6$, one from state $s_4$ and one from state $S_5$. The log domain probability of $s_4$, $\beta(4)$, and the log domain probability of $s_5$, $\beta(5)$, have been previously determined. Similarly, the log domain edge probabilities $\gamma^4$ and $\gamma^5$, have been previously determined. The objective is to compute the log domain probability of the state $s_6$, $\beta(6)$, from the foregoing parameters.

In this example, the calculation of the natural log domain probability $\beta(6)$ can be expressed using the following equation:

$$\beta(6)=\mathrm{MAX}^*(\beta(4)+\gamma^4,\beta(5)+\gamma^5)$$

where the function MAX*(A,B) is defined as before.

Figure 4B:
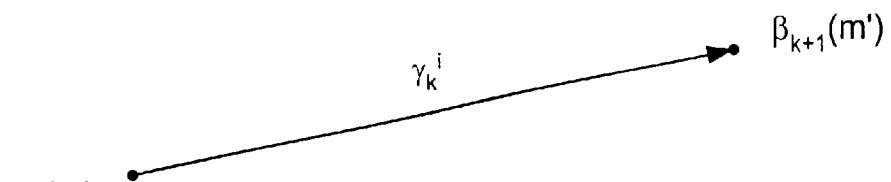
FIG. 4B is an example of the calculation of a forward state probability.

In step 124, at the point where the forward and reverse probabilities meet, the joint log domain probabilities $\lambda_k^i = \alpha_k(m)+\gamma_k^i+\beta_{k+1}(m')$ are computed for all edges at the point of overlap. This process is illustrated in FIG. 4B. Referring to the leftmost state as state m at time k, and the rightmost state as state m' at time k+1, it is assumed that the forward state log domain probability $\alpha_k(m)$, the reverse state log domain probability $\beta_{k+1}(m')$, and the edge log domain probability $\gamma_k^i$ have all been computed. This step involves adding these probabilities, i.e., performing the computation $\lambda_k^i=\alpha_k(m)+\gamma_k^i+\beta_{k+1}(m')$ in order to compute the joint log domain probability of transitioning between the two states along the prescribed edge.

In step 125, in the case in which source bits are being estimated, the log-likelihood ratio LLR at the point of adjacency is determined by computing the MAX* of all the joint probabilities $\lambda_k^i$ which imply a source bit of 1 and subtracting from it the MAX* of all the joint probabilities which imply a source bit of 0. This computation may be expressed by the following equation:

$$LLR_k = \mathrm{MAX}^*_{\nabla i\ that\ imply\ release\ of\ 1}(\lambda_k^i) - \mathrm{MAX}^*_{\nabla i\ that\ imply\ release\ of\ 0}(\mu_k^i)$$

This value may then be used to estimate the source bit at time k. If the value is greater than 0, the source bit is estimated to be a 1; if the value is less than 0, the source bit is estimated to be a 0.

A similar process is employed in the case in which symbols are being estimated, except that a log-likelihood, $LL_k$, is determined at the point of adjacency rather than a log-likelihood ratio. A log-likelihood may be determined for each of the possible symbols. The log-likelihood for a symbol p at time k, $LL_k(p)$, may be expressed by the following equation:

$$LL_k(p)=\mathrm{MAX}^*_{\nabla i\ that\ imply\ release\ of\ symbol\ p}(\lambda_k^i)=\mathrm{MAX}_{\nabla i}^*(\lambda_k^i)$$

These values may be used to form an estimate of the symbol at time k.

This process may then be repeated at other points of adjacency. In one embodiment, the process is repeated until estimates and reliability metrics have been prepared for each of the symbols in the block.

The estimates of the source bits or the coded symbols, or the underlying log-likelihood values or ratios, are what is referred to as "soft outputs" of the decoder.

B. Embodiments of the Invention

Figure 6:
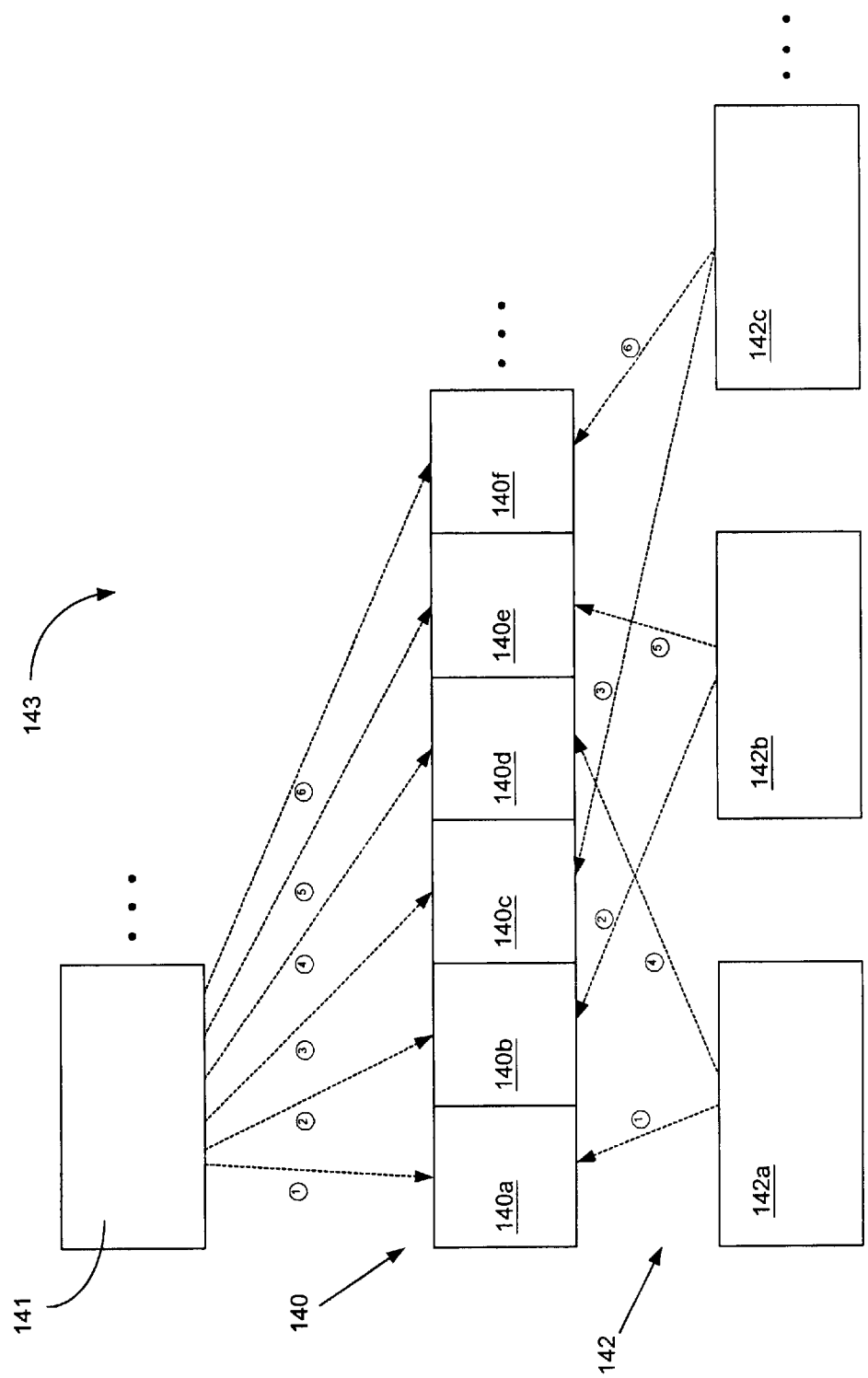
FIG. 6 illustrates an embodiment of a decoding system in accordance with the subject invention.

In one embodiment of the invention, illustrated in FIG. 6, a MAP decoding system 143 is provided in which a forward engine 141 and a plurality of backward engines 142 operate in unison to calculate the soft outputs for sub-blocks 140 within a sliding window of a larger block. The sub-blocks may be stored in a memory, whether RAM, disk or the like. For purposes of illustration, one forward engine 141 and three backward engines 142a, 142b, 142c are shown, but it should be appreciated that embodiments are possible in which more than one forward engine are provided, and in which two, four or more than four backward engines correspond to each forward engine. The backward engines 142 operate concurrently to recursively calculate backward state probabilities over at least partly non-overlapping portions of a block. For purposes of illustration, six equally-sized sub-blocks 140a, 140b, 140c, 140d, 140e, and 140f are shown, but it should be appreciated that embodiments are possible in which more or less than six sub-blocks are within the sliding window, and in which the sub-blocks are of unequal size. In one implementation, the engines are separate physical processors. In another implementation, the engines are software processes that may be executed by the same or different processor. The backward engines may operate independently or may operate in synchronization with one another.

By way of illustration and not limitation, the backward engines may operate sequentially. More specifically, backward engine 142a may calculate the backward state probabilities for sub-block 140a, followed by the calculation of backward state probabilities for sub-block 140b by backward engine 142b, followed by the calculation of backward state probabilities for sub-block 140c by backward engine 142c. Then, backward engine 142a may calculate the backward state probabilities for sub-block 140d, followed by the calculation of backward state probabilities for sub-block 140e by backward engine 142b, followed by the calculation of backward state probabilities for sub-block 140f by backward engine 142c.

Alternatively, some or all of these steps may occur in parallel. For example, the backward state probabilities for sub-blocks 140a, 140b, and 140c may be calculated in parallel by, respectively, backward engines 142a, 142b, and 142c. Then, backward state probabilities for sub-blocks 140d, 104e, and 140f maybe calculated in parallel by, respectively, backward engines 140d, 140e, and 140f.

Those of ordinary skill in the art will appreciate that other orders of calculation are possible in which the backward engines operate in unison to calculate the backward state probabilities for the sub-blocks 140a, 140b, 140c, 140d, 140e, and 140f.

In synchronization with the calculation of backward state probabilities by the backward engines, the forward engine 141 recursively calculates forward probabilities over successive sub-blocks. For example, after the backward state probabilities have been computed for sub-block 140a, forward engine 141 may begin the computation of the forward state probabilities for that sub-block. Similarly, when the backward state probabilities have been computed for sub-block 140b, forward engine 141 may begin the computation of the forward state probabilities for that sub-block. The same holds true for the remaining sub-blocks within the sliding window. In one embodiment, the order in which the forward engine operates on the sub-blocks matches the physical order of the sub-blocks. More specifically, the forward engine 141 may first calculate the forward state probabilities for sub-block 140a, followed by the forward state probabilities for sub-block 140b, followed by the forward state probabilities for sub-block 140c, followed by the forward state probabilities for sub-block 140d, followed by the forward state probabilities for sub-block 140e, followed by the forward state probabilities for sub-block 140f.

In synchronization with the calculation of the forward probabilities, the forward engine may calculate and release soft outputs for the sub-blocks. Thus, the order in which the soft outputs may be released may match the physical order of the sub-blocks. Thus, for example, the soft outputs for sub-block 140a may be released followed by those for sub-blocks 140b, 140c, 140d, 140e, and 140f.

The sliding window may then be moved forward or backward and the calculations performed on a different portion of the block. The movement of the sliding window may occur through the forward engine or one of the backward engines. Alternatively, it may occur through a distinct processor configured to perform this function. The process may repeat itself until the entire block has been processed.

Since the soft outputs are released in synchronization with the calculation of forward state probabilities by the forward engine, the order of release of the soft outputs may match the physical order of the sub-blocks. This is advantageous compared to the approach described in the Viterbi reference because it allows for more efficient utilization of memory, and less complicated interfacing of downstream applications which utilize the soft outputs. Although the release of the soft outputs is synchronized with the calculation of the forward state probabilities, implementations are possible in which, at the expense of a slight increase in memory, the release of the soft outputs may be deferred from the calculation of the forward state probabilities.

Although FIG. 6 illustrates a single forward engine 141, it should be appreciated that implementations are possible in which more than one forward engine is provided. In these implementations, the multiple forward engines could operate concurrently or in parallel on different sub-blocks. However, since forward state probabilities are recursively defined, the forward engines would typically have to go through a mode of "acquire" processing before reliable results are obtained. Such "acquire" processing is discussed infra in relation to the descriptions of FIGS. 7 and 8.

Similarly, although FIG. 6 illustrates a plurality of reverse engines 142a, 142b, and 142c, it should be appreciated that implementations are possible in which, at the expense of processing speed, only one reverse engine is provided.

Figure 7:
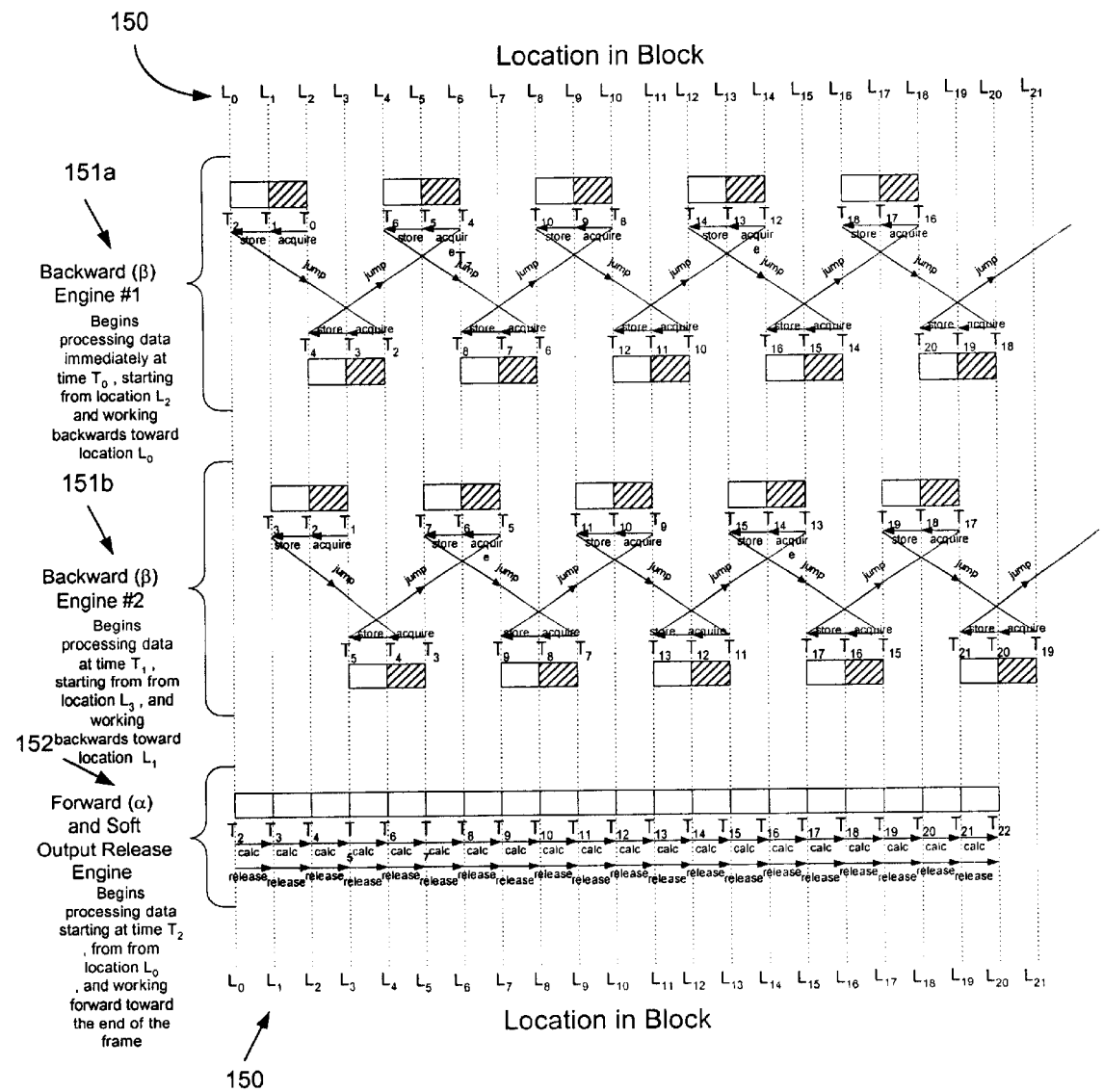
FIG. 7 illustrates a first example of a system in accordance with the subject invention.

An example of a MAP decoding system in accordance with the subject invention is illustrated in FIG. 7. In this exemplary embodiment, two backward engines 151a and 151b and one forward engine 152 are provided. The locations of the block being processed are identified with numeral 150. The sub-blocks are the areas which are demarcated by the block locations $L_0$, $L_1$, etc.

The backward engines can begin operating at any portion of the block and will eventually begin producing reliable results, i.e., reliable backward state probabilities. A rule of thumb is that the backward engines require about 5–6 constraint lengths of processing before they begin producing reliable results. These 5–6 constraint lengths are referred to as the traceback length. Processing by the backward engines over the traceback length is referred to in the figure with the "acquire" label. The period over which the backward engines produce reliable results is referred to in the figure with the "store" label. That is because these results are typically stored in a volatile memory such as RAM. Processing during the traceback length will hereinafter be referred to as "acquire" processing and the subsequent phase in which reliable results are produced will be referred to as "reliable" or "store" processing.

In FIG. 7, it can be seen that the traceback length is equal to the store period over which the backward engine produces reliable results, and both are equal to one sub-block length. However, it should be appreciated that embodiments are possible in which the traceback length is different from the store length, and in which one or both of traceback and store lengths are greater than one sub-block.

The timing and manner in which the backward engines perform their operations are indicated in the figure. For example, during time $T_0$–$T_1$, backward engine 151a performs acquire processing of sub-block $L_1$–$L_2$, and during time $T_1$–$T_2$, it performs reliable processing of sub-block $L_0$–$L_1$. Concurrently with these functions, backward engine 151b, during time $T_1$–$T_2$, performs acquire processing of sub-block $L_2$–$L_3$, and during time $T_2$–$T_3$, performs reliable processing of sub-block $L_1$–$L_2$.

Meanwhile backward engine 151a, during time $T_2$–$T_3$, performs acquire processing of sub-block $L_3$–$L_4$, followed, during time $T_3$–$T_4$, by reliable processing of sub-block $L_2$–$L_3$. Concurrently with these functions, backward engine 151b, during time $T_3$–$T_4$, performs acquire processing of sub-block $L_4$–$L_5$, and during time $T_4$–$T_5$, performs reliable processing of sub-block $L_3$–$L_4$.

The backward engines then continue to operate in tandem as illustrated in the figure until the entire block has been processed. Note that, in this exemplary embodiment, reliable results for the sub-blocks are sequentially produced in the same order as the physical sub-blocks. That is to say, during $T_1$–$T_2$, reliable results are produced (by engine 151a) for sub-block $L_0$–$L_1$. Then, during time $T_2$–$T_3$, reliable results are produced (by engine 151b) for sub-block $L_1$–$L_2$. This is followed by time $T_3$–$T_4$, when reliable results are produced (by engine 151a) for sub-block $L_2$–$L_3$. This is followed by time $T_4$–$T_5$, when reliable results are produced (by engine 151b) for sub-block $L_3$–$L_4$. The process then continues in this fashion as illustrated in the figure.

The forward engine 152 operates in tandem with the completion of processing of reliable backward state probabilities for the various sub-blocks. That is to say, after reliable backward state probabilities are determined for sub-block $L_0$–$L_1$ during time $T_1$–$T_2$, the forward engine 152 performs, during time $T_2$–$T_3$, the calculation of forward state probabilities for sub-block $L_0$–$L_1$. At the same time, or synchronized with the calculation of the forward state probabilities, the forward engine 152 may use the immediately available forward state probabilities and the stored backward state probabilities to calculate and release soft outputs for sub-block $L_0$–$L_1$. Then, after reliable backward state probabilities are determined for sub-block $L_1$–$L_2$ during time $T_2$–$T_3$, the forward engine 152 performs, during time $T_3$–$T_4$, the calculation of forward state probabilities for sub-block $L_1$–$L_2$. At the same time, or synchronized with the calculation of the forward state probabilities, the forward engine 152 may calculate and release soft outputs for sub-block $L_1$–$L_2$. The process then continues in the same manner until soft outputs for the entire block have been released. Note that the order in which the forward engine 152 processes sub-blocks to compute forward state probabilities and release soft outputs in this exemplary embodiment is the same as the physical order of the sub-blocks.

Note also that the latency in this exemplary embodiment, in terms of traceback lengths, is equal to four. This is the delay between the time the system began acquire processing of a sub-block and the time the system completed the release of soft outputs for that sub-block. For example, consider sub-block $L_1$–$L_2$. The system began acquire processing of this sub-block at time $T_0$. Yet, it did not complete the release of soft outputs for that sub-block until time $T_4$. Since each time period is assumed equal to a traceback length in this example, the total latency is four traceback lengths.

Figure 8:
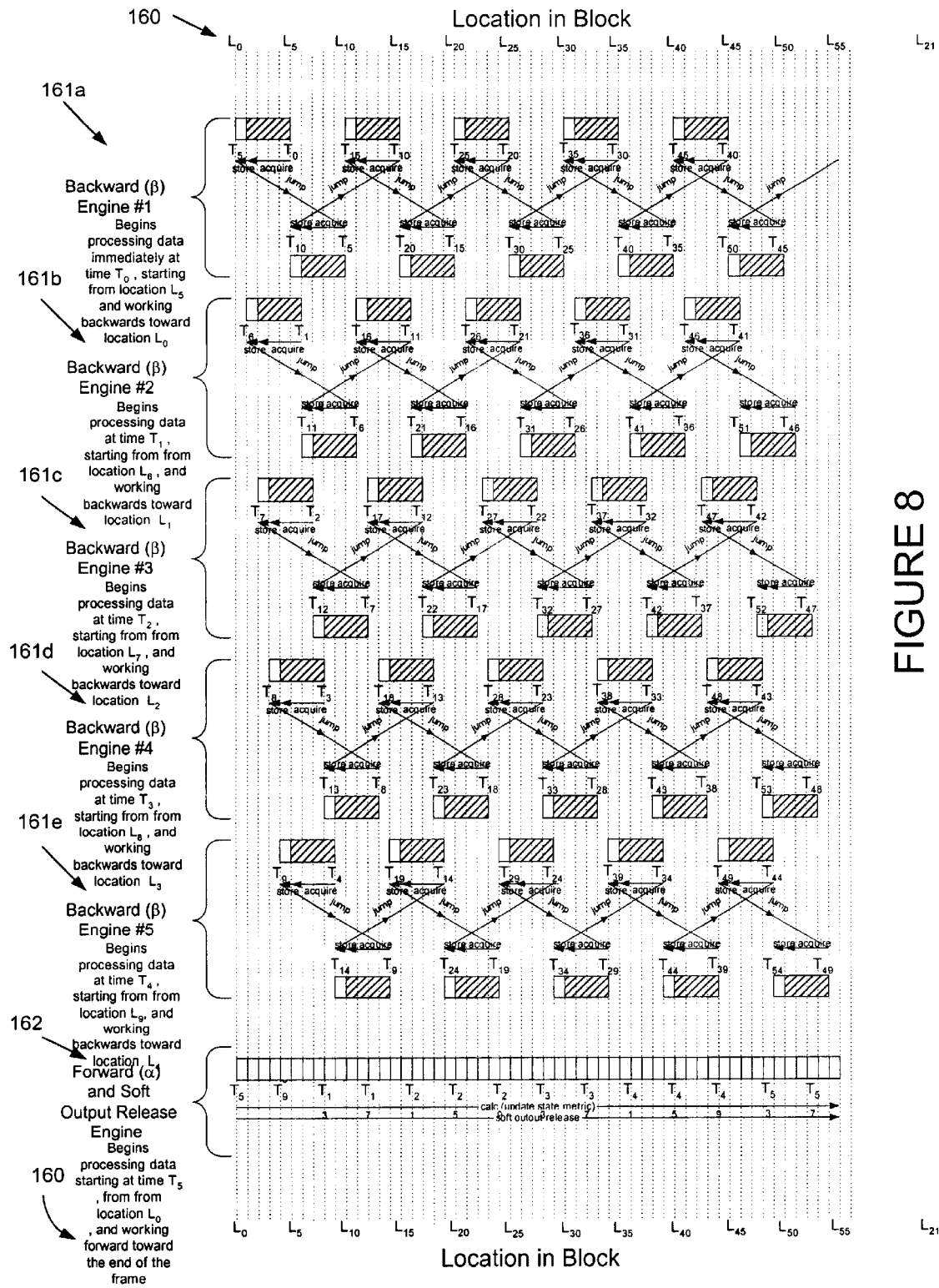
FIG. 8 illustrates a second example of a system in accordance with the subject invention.

A second example of a MAP decoding system in accordance with the subject invention is illustrated in FIG. 8. In this exemplary embodiment, five backward engines 161a, 161b, 161c, 161d, and 161e, and one forward engine 162 are provided. The locations of the block being processed are identified with numeral 160. The sub-blocks are the areas which are demarcated by the block locations $L_0$, $L_1$, etc.

As with the previous example, the backward engines can begin operating at any portion of the block and will eventually begin producing reliable results, i.e., reliable backward state probabilities, after processing over the traceback length. As before, processing by the backward engines over the traceback length is referred to in the figure with the "acquire" label. The period over which the backward engines produce reliable results is referred to in the figure with the "store" label. Processing during the traceback length will hereinafter be referred to as "acquire" processing and the subsequent phase in which reliable results are produced will be referred to as "reliable" or "store" processing.

In FIG. 8, it can be seen that the traceback length is equal to four time periods, while the store period over which the backward engine produces reliable results is equal to a single time period. In other words, the store period is equal to ¼the traceback length.

The timing and manner in which the backward engines perform their operations are indicated in the figure. For example, during time $T_0$–$T_4$, backward engine 161a performs acquire processing of sub-block $L_1$–$L_5$, and during time $T_4$–$T_5$, it performs reliable processing of sub-block $L_0$–$L_1$. Concurrently with these functions, backward engine 161b, during time $T_1$–$T_5$, performs acquire processing of sub-block $L_2$–$L_6$, and during time $T_5$–$T_6$, performs reliable processing of sub-block $L_1$–$L_2$.

Meanwhile backward engine 161c, during time $T_2$–$T_6$, performs acquire processing of sub-block $L_3$–$L_7$, followed, during time $T_6$–$T_7$, by reliable processing of sub-block $L_2$–$L_3$. Concurrently with these functions, backward engine 161d, during time $T_3$–$T_7$, performs acquire processing of sub-block $L_4$–$L_8$, and during time $T_7$–$T_8$, performs reliable processing of sub-block $L_3$–$L_4$.

Meanwhile backward engine 161e, during time $T_4$–$T_8$, performs acquire processing of sub-block $L_5$–$L_9$, followed, during time $T_8$–$T_9$, by reliable processing of sub-block $L_4$–$L_5$.

The backward engines then continue to operate in tandem as illustrated in the figure until the entire block has been processed. Note that, in this exemplary embodiment, reliable results for the sub-blocks are sequentially produced in the same order as the physical sub-blocks. That is to say, during $T_4$–$T_5$, reliable results are produced (by engine 161a) for sub-block $L_0$–$L_1$. Then, during time $T_5$–$T_6$, reliable results are produced (by engine 161b) for sub-block $L_1$–$L_2$. This is followed by time $T_6$–$T_7$, when reliable results are produced (by engine 161c) for sub-block $L_2$–$L_3$. This is followed by time $T_7$–$T_8$, when reliable results are produced (by engine 161d) for sub-block $L_3$–$L_4$. The process then continues in this fashion as illustrated in the figure.

The forward engine 162 operates in tandem with the completion of processing of reliable backward state probabilities for the various sub-blocks. That is to say, after reliable backward state probabilities are determined for sub-block $L_0$–$L_1$ during time $T_4$–$T_5$, the forward engine 162 performs, during time $T_5$–$T_6$, the calculation of forward state probabilities for sub-block $L_0$–$L_1$. At the same time, or synchronized with the calculation of the forward state probabilities, the forward engine 162 may calculate and release soft outputs for sub-block $L_0$–$L_1$. Then, after reliable backward state probabilities are determined for sub-block $L_1$–$L_2$ during time $T_5$–$T_6$, the forward engine 162 performs, during time $T_6$–$T_7$, the calculation of forward state probabilities for sub-block $L_1$–$L_2$. At the same time, or synchronized with the calculation of the forward state probabilities, the forward engine 162 may calculate and release soft outputs for sub-block $L_1$–$L_2$. The process then continues in the same manner until soft outputs for the entire block have been released. Note that the order in which the forward engine 162 processes sub-blocks to compute forward state probabilities and release soft outputs in this exemplary embodiment is the same as the physical order of the sub-blocks.

Note also that the latency in this exemplary embodiment, in terms of traceback lengths, is equal to 2.5. For example, consider sub-block $L_4$–$L_5$. The system began acquire processing of this sub-block at time $T_0$. Yet, it did not complete the release of soft outputs for that sub-block until time $T_{10}$. Since four time periods are assumed equal to a traceback length in this example, the total latency is 2.5 traceback lengths.

Figure 9:
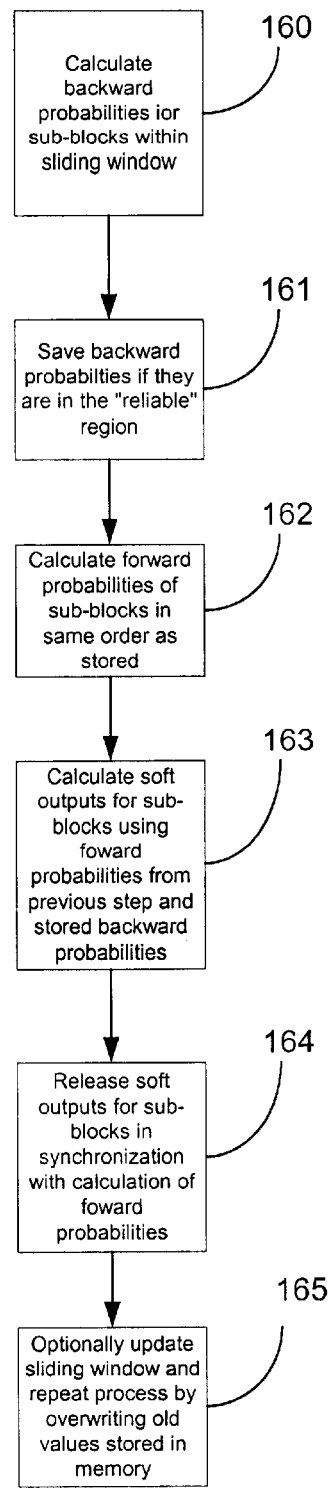
FIG. 9 illustrates a flowchart of a method in accordance with the subject invention.

An embodiment of a method of operation in accordance with the subject invention is illustrated in FIG. 9. The process begins with step 160, in which backward state probabilities are computed for sub-blocks within a sliding window. Step 160 is followed by step 161, in which backward state probabilities are stored if they are in the "reliable" region. Step 161 is followed by step 162 in which forward state probabilities are computed for the sub-blocks in the sliding window in the same order in which the sub-blocks are stored. Step 162 is followed by step 163, in which soft outputs are calculated for the sub-blocks using the forward probabilities computed in step 162 and the stored backward probabilities. Step 163 is followed by step 164 in which the soft outputs computed in step 163 are released in synchronization with the calculation of the forward state probabilities. Step 164 is followed by optional step 165, in which the sliding window is moved forward or backward, and the foregoing process repeated by overwriting the old values stored in memory. The overall process may be continued until the entire block has been processed.

The method may be tangibly embodied in the form of a series of instructions stored on a computer or processor readable medium including without limitation RAM, ROM, PROM, EPROM, EEPROM, floppy disk, hard disk, CD-ROM, etc. A volatile memory such as RAM is typically required for the storage of backward state probabilities. A small amount of RAM may also be required for forward state probabilities. In one implementation, the RAM is large enough to accommodate all the calculated reliable backward probabilities within a sliding window and a column of forward probabilities within the sliding window.

While embodiments, implementations, and implementation examples have been shown and described, it should be apparent that there are many more embodiments, implementations, and implementation examples that are within the scope of the subject invention. Accordingly, the invention is not to be restricted, except in light of the appended claims and their equivalents.

What is claimed is:

1. A MAP decoding system comprising:
    a memory for storing a block of encoded symbols received over a channel, the block having sub-blocks;
    at least one backward engine for calculating reverse state probabilities for sub-blocks within a sliding window; and
    at least one forward engine for successively calculating, in the same order as the encoded symbols in the sub-blocks are stored, forward state probabilities for the sub-blocks within the sliding window, wherein the calculation of the forward state probabilities for a sub-block are deferred until the completion of the calculation of backward state probabilities for the sub-block;
    wherein the at least one forward engine is also configured to calculate and release, responsive to the calculated backward and forward state probabilities, soft outputs for the sub-block in synchronization with the calculation of the forward state probabilities.

2. The system of claim 1 wherein the one or more backward engines are processors.

3. The system of claim 1 wherein the one or more backward engines are software processes executable on a processor.

4. The system of claim 1 wherein the one or more forward engines are processors.

5. The system of claim 1 wherein the one or more forward engines are software processes executable on a processor.

6. The system of claim 1 wherein the one or more backward processors are configured to operate in unison to calculate the backward state probabilities for the sub-blocks.

7. The system of claim 6 wherein the one or more backward processors are configured to operate in tandem to calculate the backward state probabilities for the sub-blocks.

8. The system of claim 1 wherein the one or more backward processors are configured to operate concurrently on at least some of the sub-blocks.

9. The system of claim 8 wherein the one or more backward processors are configured to operate in parallel on at least some of the sub-blocks.

10. The system of claim 1 wherein the sub-blocks are of equal length.

11. The system of claim 1 wherein the sub-blocks are of unequal length.

12. The system of claim 1 wherein the sliding window is moved throughout the block until soft outputs have been computed for the entire block.

13. The system of claim 1 wherein the one or more backward processors are configured to perform acquire processing over a traceback length prior to performing reliable processing.

14. The system of claim 13 wherein the traceback length is 5–6 constraint lengths.

15. The system of claim 13 wherein the traceback length is 1 constraint length.

16. The system of claim 1 wherein the soft outputs are estimates of coded symbols.

17. The system of claim 1 wherein the soft outputs are estimates of uncoded source bits.

18. The system of claim 1 in a receiver.

19. The receiver of claim 18 in a transceiver.

20. The transceiver of claim 19 in a communications device.

21. The communications device of claim 20 which is a wireless communications device.

22. The communications device of claim 20 which is a wireline communications device.

23. The communications device of claim 20 which is a satellite communications device.

24. The satellite communications device of claim 23 which is a set-top box.

25. The system of claim 1 further comprising a second memory for storing reliable backward state probabilities for the sub-blocks within the sliding window.

26. The system of claim 25 wherein the second memory is the same as or distinct from the memory for storing the encoded symbols of the block.

27. The system of claim 26 wherein the second memory is a volatile memory.

28. The system of claim 27 wherein the forward engine is configured to calculate soft outputs for a sub-block from immediately produced forward state probabilities for the sub-block and backward state probabilities for the sub-block stored in the second memory.

29. The system of claim 1 wherein the sub-blocks may be of unequal size.

30. The system of claim 1 wherein the sub-blocks are of equal size.

31. The system of claim 1 further comprising a processor, which may be the same as or different from the forward or reverse engines, for moving the sliding window throughout the block.

32. A method of operating a MAP decoder comprising the steps of:
   storing in a memory a block of encoded symbols as received over a channel, the block having sub-blocks;
   calculating backward probabilities for sub-blocks within a sliding window;
   successively calculating forward probabilities for the sub-blocks within the sliding window in the order in which the encoded symbols within the sub-blocks are stored;
   deferring calculation of the forward probabilities for a sub-block until the backward probabilities for the sub-block have been computed; and
   calculating and releasing, responsive to the calculated forward and backward probabilities, soft outputs for the sub-blocks within the sliding window in synchronization with the calculation of forward probabilities for the sub-blocks.

33. The method of claim 32 further comprising moving the sliding window throughout the block, and repeating the foregoing process steps until soft outputs have been released for the entire block.

34. A computer readable medium on which is stored a series of instructions embodying the method steps of claim 32.

35. A computer readable medium tangibly embodying the method of claim 32.

36. The method of claim 32 further comprising storing, for each sub-block, at least some of the backward probabilities for the sub-block.

37. The method of claim 36 further comprising calculating, for each sub-block, forward probabilities for the sub-block in the same order as the encoded symbols for the sub-block are stored.

38. The method of claim 37 further comprising computing, for each sub-block, soft outputs in synchronization with the calculation of forward probabilities for the sub-block.

39. A MAP decoding system comprising:
   means for storing a block of encoded symbols as received over a channel, the block having sub-blocks;
   backward engine means for calculating reverse state probabilities for sub-blocks within a sliding window;
   deferring calculation means for deferring the calculation of forward state probabilities for a sub-block until backward state probabilities for the sub-block have been calculated; and
   forward engine means for calculating the forward state probabilities for the sub-blocks within the sliding window, and also for calculating and releasing, responsive to the calculated backward and forward state probabilities, soft outputs for the sub-blocks in synchronization with the calculation of the forward state probabilities.

40. The system of claim 39 further comprising means, which may be the same as or different from the forward or reverse engine means, for moving the sliding window throughout the block.

41. A MAP decoding system comprising:
   a memory for storing a block of encoded symbols as received over a channel;
   at least one backward engine for calculating reverse state probabilities for a portion of the block within a sliding window; and
   at least one forward engine for calculating forward state probabilities for the portion of the block within the sliding window, where the forward engine is configured to defer the forward engine calculation for the portion of the block until backward state probabilities for the portion of the block have been calculated, the forward engine calculation being in the same order as the encoded symbols for the portion are stored in the memory;
   wherein the forward engine is also configured to calculate and release, responsive to the calculated backward and forward state probabilities for the portion, soft outputs for the portion in synchronization with the calculation of the forward state probabilities for the portion.

42. The system of claim 41 further comprising a processor, which may be the same as or different from the forward or backward engines, which is configured to move the sliding window throughout the block.

43. The systems of any of claims 1, 39, or 41, wherein the MAP decoder is a log MAP decoder.

44. A method of operating a MAP decoder comprising the steps of:
   storing in a memory a block of encoded symbols as received over a channel;
   calculating, for a portion of the block within a sliding window, backward probabilities;
   calculating, for the portion of the block, forward probabilities in the same order as the encoded symbols for the portion are stored, where the forward probabilities for the portion of the block are calculated after calculating the backward probabilities; and
   calculating and releasing, responsive to the calculated forward and backward probabilities, soft outputs for the portion in synchronization with the calculation of forward probabilities for the portion.

45. The method of claim 44 further comprising moving the sliding window through the block, and repeating the foregoing process.

46. The methods of any of claims 32 or 44, wherein the MAP decoder is a log MAP decoder.

* * * * *